(12) United States Patent
He

(10) Patent No.: US 11,302,896 B2
(45) Date of Patent: Apr. 12, 2022

(54) DISPLAY PANEL AND MANUFACTURING METHOD THEREOF, AND DISPLAY DEVICE

(71) Applicant: Shenzhen China Star Optoelectronics Semiconductor Display Technology Co., Ltd., Guangdong (CN)

(72) Inventor: Chao He, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 114 days.

(21) Appl. No.: 16/753,849

(22) PCT Filed: Dec. 27, 2019

(86) PCT No.: PCT/CN2019/129099
§ 371 (c)(1),
(2) Date: Apr. 6, 2020

(87) PCT Pub. No.: WO2021/120296
PCT Pub. Date: Jun. 24, 2021

(65) Prior Publication Data
US 2021/0184173 A1  Jun. 17, 2021

(30) Foreign Application Priority Data

Dec. 17, 2019  (CN) .......................... 201911300376.3

(51) Int. Cl.
*H01L 33/00*       (2010.01)
*H01L 51/52*       (2006.01)
*H01L 51/56*       (2006.01)

(52) U.S. Cl.
CPC ...... *H01L 51/5256* (2013.01); *H01L 51/5246* (2013.01); *H01L 51/56* (2013.01)

(58) Field of Classification Search
CPC .. H01L 51/5256; H01L 51/5246; H01L 51/56
See application file for complete search history.

(56) References Cited

U.S. PATENT DOCUMENTS

2008/0309226 A1    12/2008  Kim
2016/0372697 A1*   12/2016  Kakizoe ................. H01L 51/56
(Continued)

FOREIGN PATENT DOCUMENTS

| CN | 106450032 A | 2/2017 |
| CN | 110048018 A | 7/2019 |
| KR | 20130061471 A | 6/2013 |

*Primary Examiner* — Victor A Mandala
*Assistant Examiner* — Colleen E Snow
(74) *Attorney, Agent, or Firm* — Mark M. Friedman

(57) ABSTRACT

A display panel and a manufacturing method thereof, and a display device are provided. The display panel includes a substrate and a display layer disposed on the substrate. Furthermore, a thin-film encapsulation structure is disposed on the display layer. The thin-film encapsulation structure includes a first barrier layer and a first buffer layer which are disposed sequentially, and two lateral sections of the first barrier layer and the first buffer layer disposed on the first barrier layer are respectively packaged by a first lateral sectional barrier layer. A width of the first barrier layer and a width of the first buffer layer are equal.

12 Claims, 6 Drawing Sheets

(56) References Cited

U.S. PATENT DOCUMENTS

| | | |
|---|---|---|
| 2018/0212192 A1 | 7/2018 | Jin et al. |
| 2018/0219172 A1* | 8/2018 | Senoo .................. H01L 51/5203 |
| 2019/0312231 A1* | 10/2019 | Huang .................... H01L 51/56 |
| 2021/0336204 A1* | 10/2021 | Sun ...................... H01L 51/5253 |

* cited by examiner

DISPLAY PANEL AND MANUFACTURING METHOD THEREOF, AND DISPLAY DEVICE

FIELD OF INVENTION

The present disclosure relates to the field of display panels, and particularly relates to a display panel and a manufacturing method thereof, and a display device.

BACKGROUND OF INVENTION

Organic light emitting diodes (OLEDs) have been widely used due to their advantages, such as good self-luminous characteristics, excellent contrasts, rapid response, and flexible display, etc.

Because materials of the OLEDs are generally polymers or small organic molecules, and a material of cathodes are generally a low-work-function reactive metal, such as Mg, or Al, etc., and these luminescent materials and cathode materials are very sensitive to water vapor and oxygen, permeation of water/oxygen can greatly reduce service life of the OLEDs. In order to achieve requirements of service life and stability of OLEDs for commercialization, requirements of encapsulation effect for OLEDs are very high. Therefore, encapsulation is located on a very important point for manufacturing OLEDs, and it is one of key factors that affects product yield.

Currently, the thin-film encapsulation manner is a preferred encapsulation manner using on self-luminous devices similar to OLEDs, etc. By depositing each functional-layer thin film on surfaces of OLED substrates to achieve a purpose of blocking water and oxygen does not need to use other cover plates, and this is easy to realize flexible display.

Overlapping a barrier layer with a buffer layer is generally used as a current thin-film encapsulation manner. In order to ensure a width of the barrier layer to be greater than a width of the buffer layer, mask plates with two different sizes may also be used to perform film formation. Please refer to FIG. 1a and FIG. 1b, FIG. 1a and FIG. 1b are respectively thin-film encapsulation structures of two different types of display panels in the prior art.

As illustrated in FIG. 1a, the display panel includes a substrate layer 11, a display layer 22, a first barrier layer 33, a first buffer layer 44, a second barrier layer 55, a second buffer layer 66, and a third barrier layer 77. Although mask plates with two types of sizes are used, an outer side of the display layer only gets barrier effect from one of the barrier layers, actually. As illustrated in FIG. 1b, mask plates with three types of sizes are used in a thin-film encapsulation structure of the display panel. An outer side of the display layer gets barrier effect from the three barrier layers, however, outer edges of the encapsulation are wide and are not conducive to designing a narrow bezel.

Therefore, it is necessary to develop a new style thin-film encapsulation structure to overcome the defect of the prior art.

SUMMARY OF INVENTION

In order to realize the purpose mentioned above, the present disclosure provides a display panel, including a substrate and a display layer disposed on the substrate. Furthermore, a thin-film encapsulation structure is disposed on the display layer. Furthermore, the thin-film encapsulation structure includes a first barrier layer and a first buffer layer which are disposed sequentially. Furthermore, two lateral sections of the first barrier layer and the first buffer layer disposed on the first barrier layer are respectively packaged by a first lateral sectional barrier layer.

Furthermore, in a different embodiment, a width of the first barrier layer and a width the first buffer layer are equal.

Furthermore, in a different embodiment, a width range of the first lateral sectional barrier layer ranges from 200 μm to 1000 μm.

Furthermore, in a different embodiment, a thickness range of the first lateral sectional barrier layer ranges from 200 μm to 2000 μm Furthermore, in a different embodiment, the first buffer layer includes a second barrier layer, a second buffer layer, and a second lateral sectional barrier layer which are sequentially disposed. The second lateral sectional barrier layer packages lateral sections of the second barrier layer and the second buffer layer, and the second lateral sectional barrier layer is connected with the first lateral sectional barrier layer.

In order to realize the purpose mentioned above, the present disclosure further provides a manufacturing method for manufacturing the display panel related to the present disclosure, which includes steps as follow:

Step S1: providing a substrate layer and the display layer.

Step S2: depositing the first barrier layer and the first buffer layer.

Step S3: depositing the first lateral sectional barrier layer on the lateral sections of the first barrier layer and the first buffer layer. Furthermore, the first lateral sectional barrier layer packages the lateral sections of the first barrier layer and the first buffer layer.

Furthermore, in a different embodiment, when depositing the first barrier layer and the first buffer layer, a same mask plate is used.

Furthermore, in a different embodiment, a laser induced chemical vapor deposition manner is used to deposit the first lateral sectional barrier layer.

Furthermore, in a different embodiment, a pyrolysis manner or a photodecomposition manner is used in the laser induced chemical vapor deposition manner.

Furthermore, in a different embodiment, a chemical vapor deposition manner or an atomic layer deposition manner is used to deposit the first barrier layer.

Furthermore, in a different embodiment, a chemical vapor deposition manner, an ink printing manner, or an atomic layer deposition manner is used to deposit the first buffer layer.

Furthermore, in a different embodiment, one of titanium nitride, aluminum nitride, silicon nitride, silicon carbide, or titanium dioxide is used as a material of the second lateral sectional barrier layer.

In order to realize the purpose mentioned above, the present disclosure further provides a display device, which includes the display panel related to the present disclosure.

Comparing the present disclosure to the prior art, the beneficial effect of the present disclosure is that the present disclosure provides a display panel and a manufacturing method thereof, and a display device. On one aspect, by using one mask plate to stack multiplicity of layers to form a film to obtain a stacked thin-film encapsulation layer, and a stacked barrier layer and a stacked buffer layer only require a mask plate with one size, so production operating cost and mask plate charges are lowered.

On another aspect, one layer of barrier layers is manufactured by using a laser induced chemical vapor deposition manner on two lateral sections of the stacked barrier layer and the stacked buffer layer to protect a thin-film encapsulation peripheral region. Though a temperature requirement of the laser induced chemical vapor deposition on a substrate is low, an actual film formation temperature is high, and a manufactured thin-film encapsulation film layer is compact, which improves encapsulation effect. Moreover, the display layer is protected by the two barrier layers, when protecting water and oxygen around the panel, narrow bezel effect can be realized due to thin-film encapsulation outer edges around the display layer being narrow.

DESCRIPTION OF DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which those skilled in the art can derive further figures without making any inventive efforts.

DETAILED DESCRIPTION OF PREFERRED EMBODIMENTS

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

The specific structural and functional details disclosed are merely representative and are for the purpose of describing exemplary embodiments of the present disclosure. However, the present disclosure may be specifically implemented in many alternative forms and should not be construed as being limited only to the embodiments set forth herein.

In the description of the present disclosure, it is to be understood, that the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly.

The First Embodiment

Figure 1A:
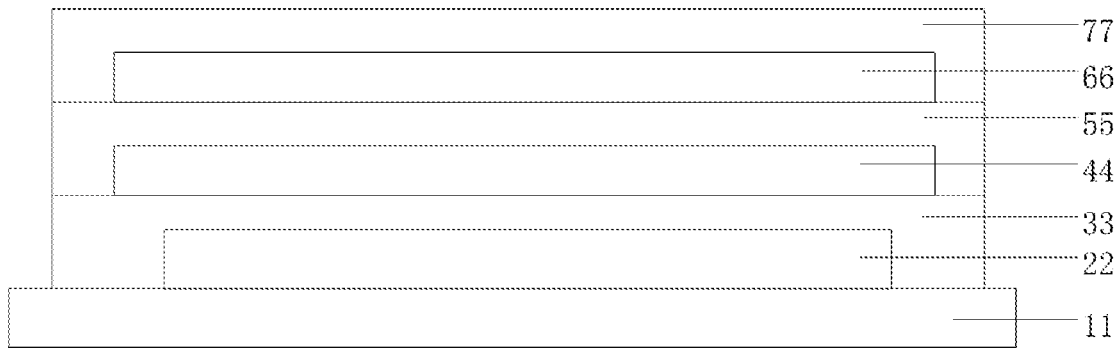
FIG. 1a is a structural schematic diagram of a display panel in the prior art.
Figure 1B:
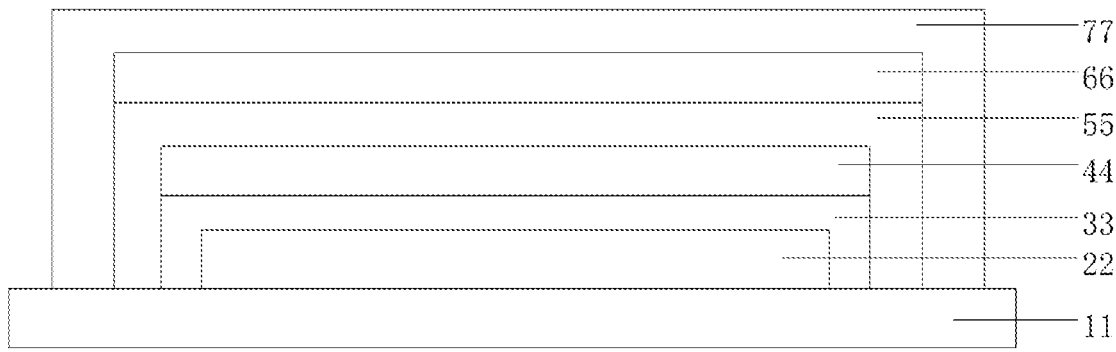
FIG. 1b is a structural schematic diagram of a display panel in the prior art.
Figure 2:
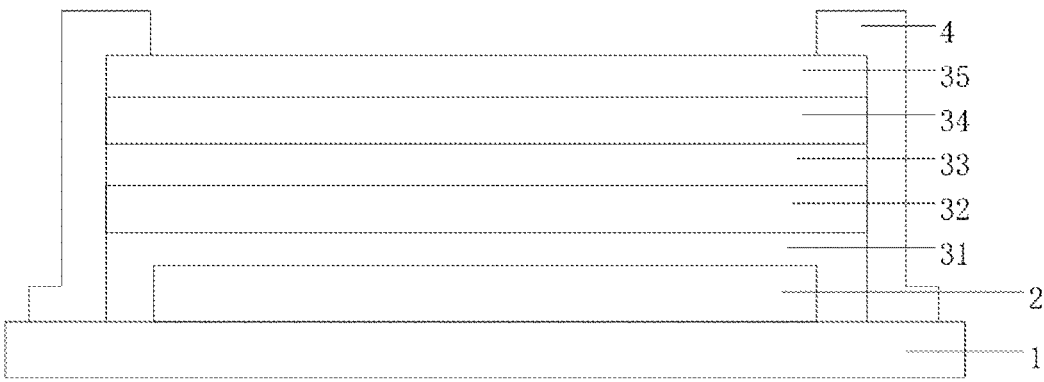
FIG. 2 is a structural schematic diagram of a display panel provided by a first embodiment of the present disclosure.

This embodiment provides a display panel. Please refer to FIG. 2, illustrated in FIG. 2 is a structural schematic diagram of the display panel provided by this embodiment. The display panel includes a substrate layer 1, a display layer 2 disposed on the substrate layer 1, a first barrier layer 31 disposed on the display layer 2, a first buffer layer 32 disposed on the first barrier layer 31, a second barrier layer 33 disposed on the first buffer layer 32, a second buffer layer 34 disposed on the second barrier layer 33, and a third barrier layer 35 disposed on the second buffer layer 34.

The display panel further includes a lateral sectional barrier layer 4. The lateral sectional barrier layer 4 is disposed on lateral sections of the first barrier layer 31, the first buffer layer 32, the second barrier layer 33, the second buffer layer 34, and the third barrier layer 35. The lateral sectional barrier layer 4 packages the lateral sections of the first barrier layer 31, the first buffer layer 32, the second barrier layer 33, the second buffer layer 34, and the third barrier layer 35 to form a protection layer to protect from intrusion of water and oxygen around the display layer 2. When the display layer 2 is protected by the two barrier layers, narrow bezel effect can be realized due to thin-film encapsulation outer edges around the display layer 2 being narrow.

Furthermore, a width range of the lateral sectional barrier layer 4 ranges from 200 μm to 1000 μm, and a thickness range of the first lateral sectional barrier layer 4 ranges from 200 μm to 2000 μm.

Widths of the first barrier layer 31, the first buffer layer 32, the second barrier layer 33, the second buffer layer 34, and the third barrier layer 35 are equal. When manufacturing the first barrier layer 31, the first buffer layer 32, the second barrier layer 33, the second buffer layer 34, and the third barrier layer 35, it only requires a mask plate with one size, which can lower production operating cost and mask plate charges.

Figure 3:
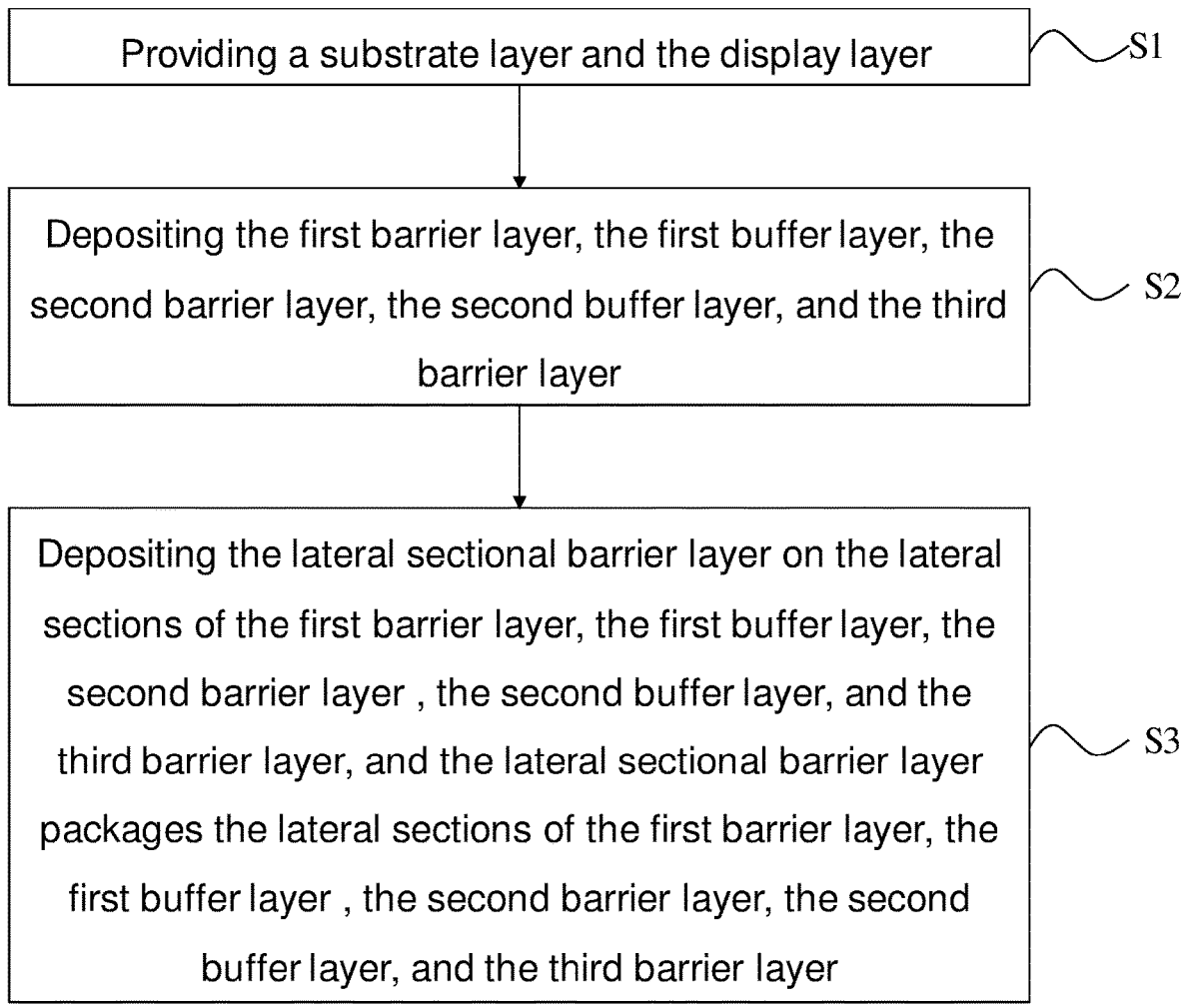
FIG. 3 is a flowchart of a manufacturing method provided by the first embodiment of the present disclosure.

This embodiment further provides a manufacturing method of the display panel. Please refer to FIG. 3, illustrated in FIG. 3 is a flowchart of the manufacturing method of the display panel provided by this embodiment, which includes steps as follow:

Step S1: providing a substrate layer 1 and the display layer 2.

Figure 4:
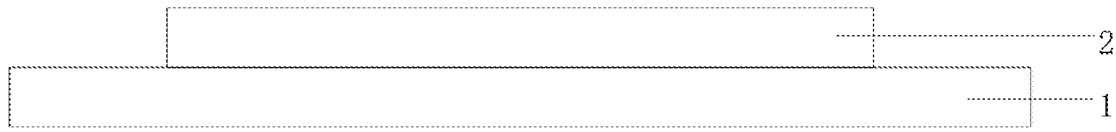
FIG. 4 is a structural schematic diagram of the display panel of a step S1 in the manufacturing method provided by the first embodiment of the present disclosure.

Please refer to FIG. 4, illustrated in FIG. 4 is a structural schematic diagram of the display panel of the step S1 in the manufacturing method provided by this embodiment.

Step S2: depositing the first barrier layer 31, the first buffer layer 32, the second barrier layer 33, the second buffer layer 34, and the third barrier layer 35.

Figure 5:
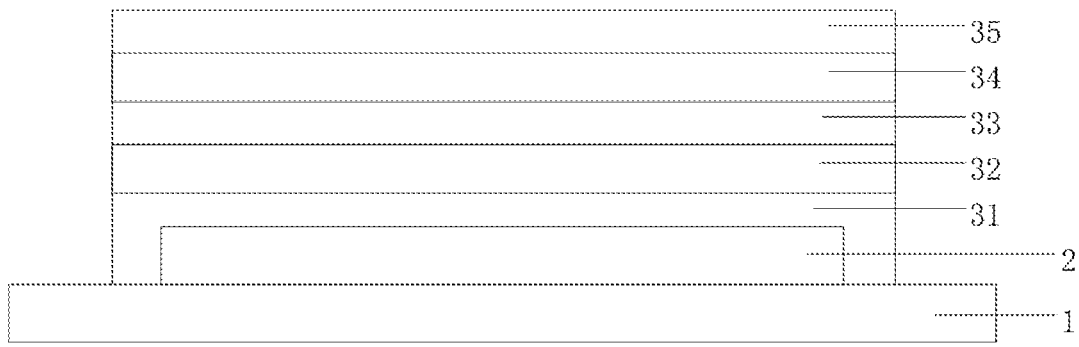
FIG. 5 is a structural schematic diagram of the display panel of a step S2 in the manufacturing method provided by the first embodiment of the present disclosure.

Please refer to FIG. 5, illustrated in FIG. 5 is a structural schematic diagram of the display panel of the step S2 in the manufacturing method provided by this embodiment.

Furthermore, the widths of the first barrier layer 31, the first buffer layer 32, the second barrier layer 33, the second buffer layer 34, and the third barrier layer 35 are equal. When depositing the first barrier layer 31, the first buffer layer 32, the second barrier layer 33, the second buffer layer 34, and the third barrier layer 35, it only requires a mask plate with one size, which can lower production operating cost and mask plate charges.

Furthermore, a chemical vapor deposition manner or an atomic layer deposition manner is used to deposit the first barrier layer 31, the second barrier layer 33, and the third barrier layer 35.

Furthermore, a chemical vapor deposition manner, an ink printing manner, or an atomic layer deposition manner is used to deposit the first buffer layer 32 and the second buffer layer 34.

Step S3: depositing the lateral sectional barrier layer 4 on the lateral sections of the first barrier layer 31, the first buffer layer 32, the second barrier layer 33, the second buffer layer 34, and the third barrier layer 35. The lateral sectional barrier layer 4 packages the lateral sections of the first barrier layer 31, the first buffer layer 32, the second barrier layer 33, the second buffer layer 34, and the third barrier layer 35.

Figure 6:
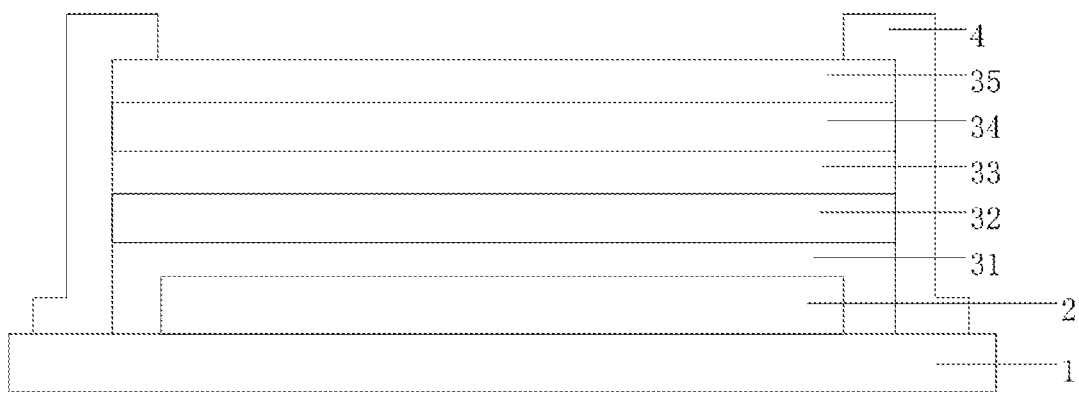
FIG. 6 is a structural schematic diagram of the display panel of a step S3 in the manufacturing method provided by the first embodiment of the present disclosure.

Please refer to FIG. 6, illustrated in FIG. 6 is a structural schematic diagram of the display panel of the step S3 in the manufacturing method provided by this embodiment.

The lateral sectional barrier layer 4 packages the lateral sections of the first barrier layer 31, the first buffer layer 32, the second barrier layer 33, the second buffer layer 34, and the third barrier layer 35 to form a protection layer to protect from intrusion of water and oxygen around the display layer 2. When the display layer 2 is protected by two barrier layers, narrow bezel effect can be realized due to thin-film encapsulation outer edges surrounding the display layer 2 being narrow.

Furthermore, a laser induced chemical vapor deposition manner is used to deposit the lateral sectional barrier layer 4, and a pyrolysis manner or a photodecomposition manner is used in the laser induced chemical vapor deposition.

Comparing the laser induced chemical vapor deposition manner to an ordinary chemical vapor deposition manner, the laser induced chemical vapor deposition manner has advantages such as a low temperature, low damage, fine fabrication, selective growth, etc. Though a temperature requirement of the laser induced chemical vapor deposition on a substrate is low, an actual film formation temperature is high, and a manufactured thin-film encapsulation film layer is compact, which improves encapsulation effect. Moreover, the laser induced chemical vapor deposition is very convenient and quick.

Furthermore, a width range of the lateral sectional barrier layer 4 ranges from 200 μm to 1000 μm, and a thickness range of the first lateral sectional barrier layer 4 ranges from 200 μm to 2000 μm.

Furthermore, one of titanium nitride, aluminum nitride, silicon nitride, silicon carbide, or titanium dioxide is used as a material of the lateral sectional barrier layer 4, and is not limited herein.

This embodiment further provides a display device, including the display panel related to this embodiment.

The Second Embodiment

Figure 7:
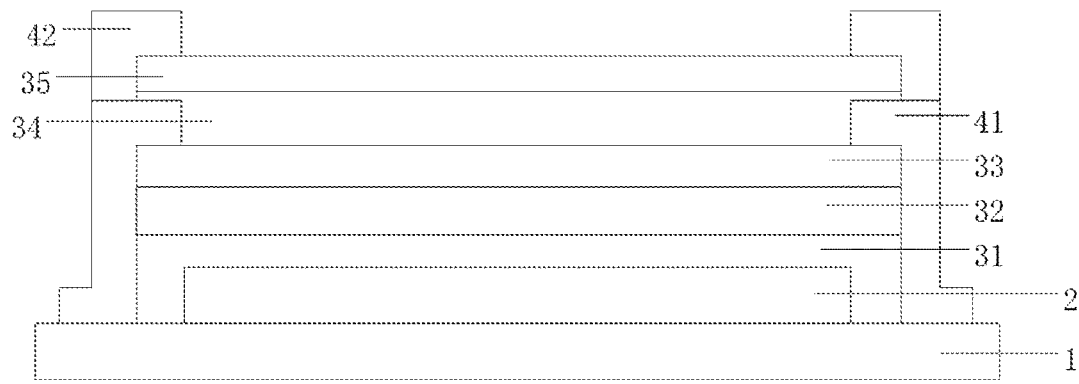
FIG. 7 is a structural schematic diagram of the display panel provided by a second embodiment of the present disclosure.

This embodiment provides a display panel, please refer to FIG. 7, illustrated in FIG. 7 is a structural schematic diagram of the display panel provided by this embodiment. The display panel includes a substrate layer 1, a display layer 2 disposed on the substrate layer 1, a first barrier layer 31 disposed on the display layer 2, a first buffer layer 32 disposed on the first barrier layer 31, and a second barrier layer 33 disposed on the first buffer layer 32.

The display panel further includes a first lateral sectional barrier layer 41. The first lateral sectional barrier layer 41 is disposed on lateral sections of the first barrier layer 31, the first buffer layer 32, and the second barrier layer 33. The first lateral sectional barrier layer 41 packages the lateral sections of the first barrier layer 31, the first buffer layer 32, and the second barrier layer 33 to form a protection layer to protect from intrusion of water and oxygen around the display layer 2. When the display layer 2 is protected by two barrier layers, narrow bezel effect can be realized due to thin-film encapsulation outer edges around the display layer 2 being narrow.

The display panel further includes a second buffer layer 34 disposed on the second barrier layer 33, a third barrier layer 35 disposed on the second buffer layer 34, a second lateral sectional barrier layer 42 disposed on lateral sections of the second buffer layer 34 and the third barrier layer 35. The second lateral sectional barrier layer 42 packages the lateral sections of the second buffer layer 34 and the third barrier layer 35, and the second lateral sectional barrier layer 42 is connected to the first lateral sectional barrier layer 41.

Furthermore, the widths of the first barrier layer 31, the first buffer layer 32, the second barrier layer 33, the second buffer layer 34, and the third barrier layer 35 are equal. When manufacturing the first barrier layer 31, the first buffer layer 32, the second barrier layer 33, the second buffer layer 34, and the third barrier layer 35, it only requires a mask plate with one size, which can lower production operating cost and mask plate charges.

Figure 8:
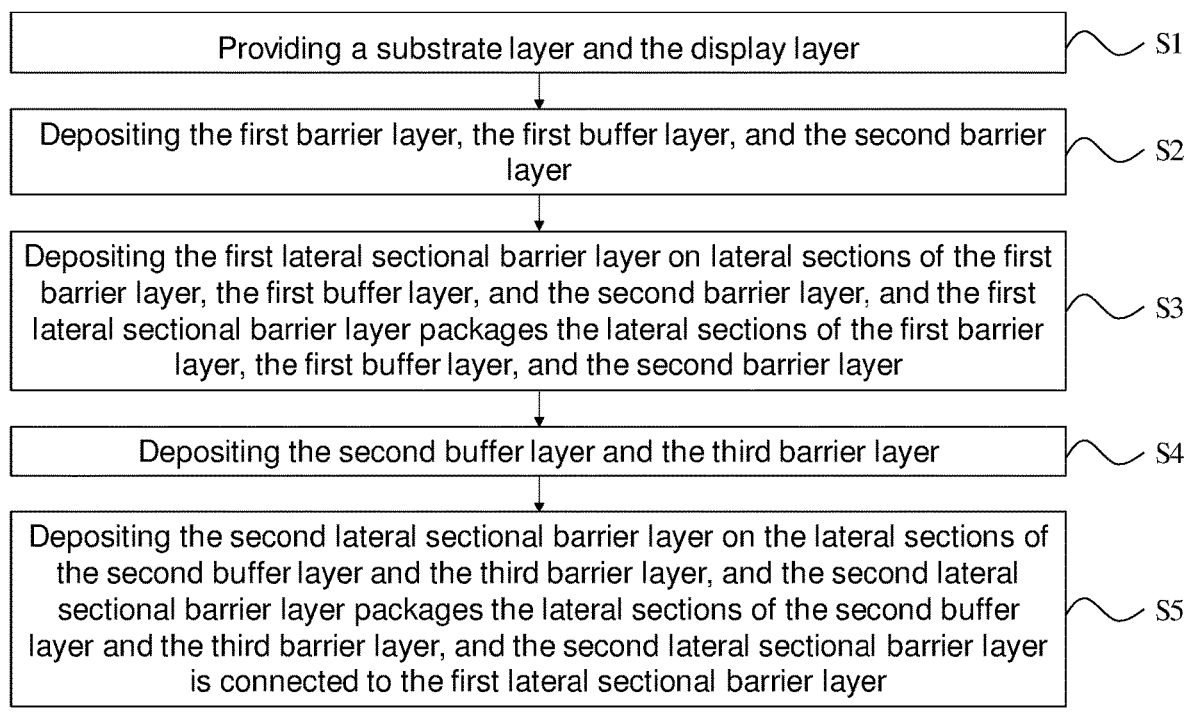
FIG. 8 is a flowchart of a manufacturing method provided by the second embodiment of the present disclosure.

This embodiment further provides a manufacturing method of the display panel. Please refer to FIG. 8, illustrated in FIG. 8 is a flowchart of the manufacturing method of the display panel provided by this embodiment, which includes steps as follow:

Step S1: providing a substrate layer 1 and the display layer 2.

Figure 9:
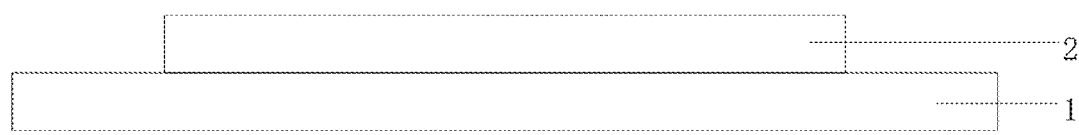
FIG. 9 is a structural schematic diagram of the display panel of a step S1 in the manufacturing method provided by the second embodiment of the present disclosure.

Please refer to FIG. 9, illustrated in FIG. 9 is a structural schematic diagram of the display panel of the step S1 in the manufacturing method provided by this embodiment.

Figure 10:
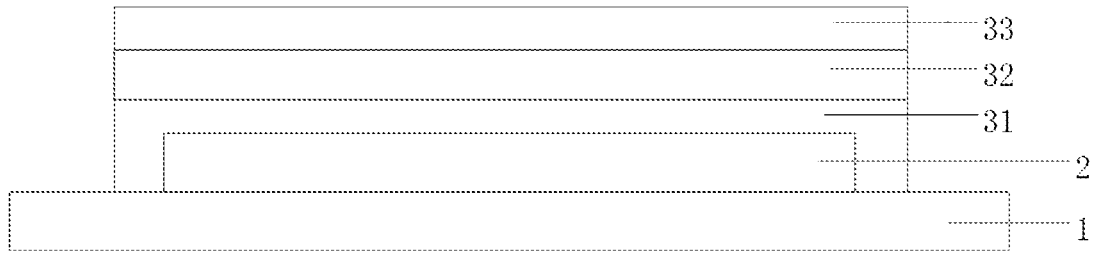
FIG. 10 is a structural schematic diagram of the display panel of a step S2 in the manufacturing method provided by the second embodiment of the present disclosure.

Step S2: depositing the first barrier layer 31, the first buffer layer 32, and the second barrier layer 33. Please refer to FIG. 10, illustrated in FIG. 10 is a structural schematic diagram of the display panel of the step S2 in the manufacturing method provided by this embodiment.

Step S3: depositing the first lateral sectional barrier layer 41 on lateral sections of the first barrier layer 31, the first buffer layer 32, and the second barrier layer 33. The first lateral sectional barrier layer 41 packages the lateral sections of the first barrier layer 31, the first buffer layer 32, and the second barrier layer 33.

Figure 11:
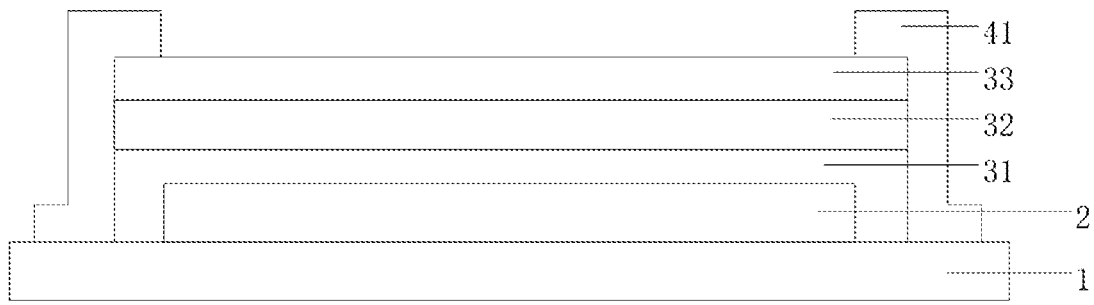
FIG. 11 is a structural schematic diagram of the display panel of a step S3 in the manufacturing method provided by the second embodiment of the present disclosure.

Please refer to FIG. 11, illustrated in FIG. 11 is a structural schematic diagram of the display panel of the step S3 in the manufacturing method provided by this embodiment.

The first lateral sectional barrier layer 41 packages the lateral sections of the first barrier layer 31, the first buffer layer 32, and the second barrier layer 33 to form a protection layer to protect from intrusion of water and oxygen around the display layer 2. When the display layer 2 is protected by the two barrier layers, narrow bezel effect can be realized due to thin-film encapsulation outer edges around the display layer 2 being narrow.

Step S4: depositing the second buffer layer 34 and the third barrier layer 35.

Figure 12:
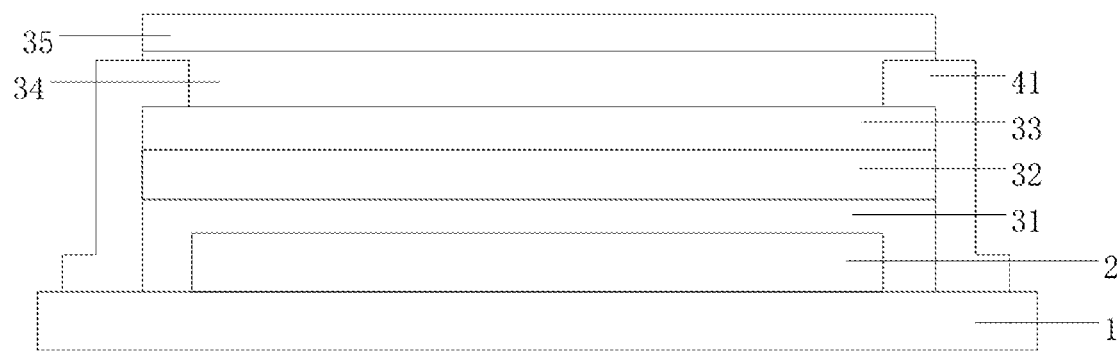
FIG. 12 is a structural schematic diagram of the display panel of a step S4 in the manufacturing method provided by the second embodiment of the present disclosure.

Please refer to FIG. 12, illustrated in FIG. 12 is a structural schematic diagram of the display panel of the step S4 in the manufacturing method provided by this embodiment.

Furthermore, the widths of the first barrier layer 31, the first buffer layer 32, the second barrier layer 33, the second buffer layer 34, and the third barrier layer 35 are equal. When depositing the first barrier layer 31, the first buffer layer 32, the second barrier layer 33, the second buffer layer 34, and the third barrier layer 35, it only requires a mask plate with one size, which can lower production operating cost and mask plate charges.

Furthermore, a chemical vapor deposition manner or an atomic layer deposition manner is used on the first barrier layer 31, the second barrier layer 33, and the third barrier layer 35.

Furthermore, a chemical vapor deposition manner, an ink printing manner, or an atomic layer deposition manner is used on the first buffer layer 32 and the second buffer layer 34.

Step S5: depositing the second lateral sectional barrier layer 42 on the lateral sections of the second buffer layer 34 and the third barrier layer 35. The second lateral sectional barrier layer 42 packages the lateral sections of the second buffer layer 34 and the third barrier layer 35, and the second lateral sectional barrier layer 42 is connected to the first lateral sectional barrier layer 41.

Figure 13:
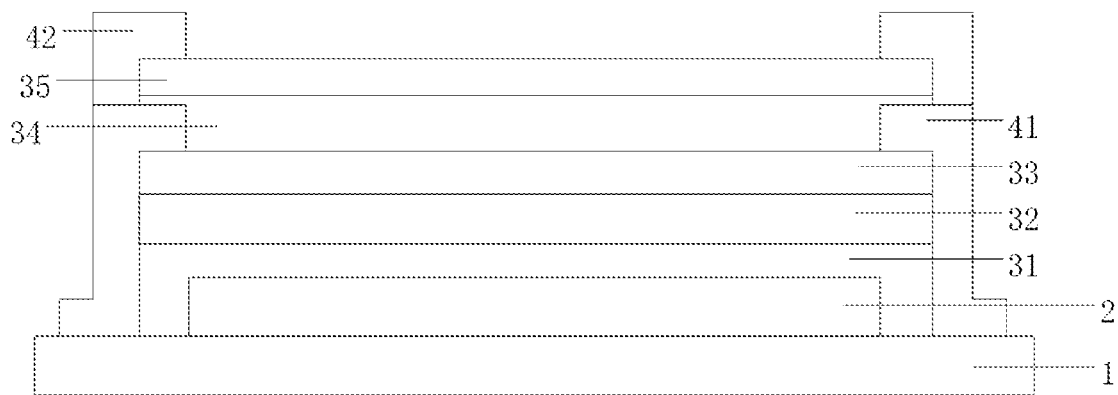
FIG. 13 is a structural schematic diagram of the display panel of a step S5 in the manufacturing method provided by the second embodiment of the present disclosure.

Please refer to FIG. 13, illustrated in FIG. 13 is a structural schematic diagram of the display panel of the step S5 in the manufacturing method provided by this embodiment.

Furthermore, a laser induced chemical vapor deposition manner is used to deposit the first lateral sectional barrier layer 41 and the second lateral sectional barrier layer 42, and a pyrolysis manner or a photodecomposition manner is used in the laser induced chemical vapor deposition.

Comparing the laser induced chemical vapor deposition manner to an ordinary chemical vapor deposition manner, the laser induced chemical vapor deposition manner has advantages such as a low temperature, low damage, fine fabrication, selective growth, etc. Though a temperature requirement of the laser induced chemical vapor deposition on a substrate is low, an actual film formation temperature is high, and a manufactured thin-film encapsulation film layer is compact, which improves encapsulation effect. Moreover, the laser induced chemical vapor deposition is very convenient and quick.

Furthermore, one of titanium nitride, aluminum nitride, silicon nitride, silicon carbide, or titanium dioxide is used as materials of the first lateral sectional barrier layer 41 and the second lateral sectional barrier layer 42, and they are not limited herein.

This embodiment further provides a display device, which includes the display panel related to this embodiment.

The beneficial effect of the present disclosure is that the present disclosure provides a display panel and a manufacturing method thereof, and a display device. On one aspect, by using one mask plate to stack multiplicity of layers to form a film to obtain a stacked thin-film encapsulation layer, and a stacked barrier layer and a stacked buffer layer only require a mask plate with one size, so production operating cost and mask plate charges are lowered.

On another aspect, one layer of barrier layer is manufactured by using a laser induced chemical vapor deposition manner on two lateral sections of the stacked barrier layer and the stacked buffer layer to protect a thin-film encapsulation peripheral region. Though a temperature requirement of the laser induced chemical vapor deposition on a substrate is low, an actual film formation temperature is high, and a manufactured thin-film encapsulation film layer is compact, which improves encapsulation effect. Moreover, the display layer is protected by the two barrier layers, when protecting water and oxygen around the panel, narrow bezel effect can be realized due to thin-film encapsulation outer edges around the display layer being narrow.

Which mentioned above is preferred embodiments of the present disclosure, it should be noted that to those skilled in the art without departing from the technical theory of the present disclosure, can further make many changes and modifications, and the changes and the modifications should be considered as the scope of protection of the present disclosure.

What is claimed is:

1. A display panel, comprising a substrate and a display layer disposed on the substrate, wherein a thin-film encapsulation structure is disposed on the display layer, the thin-film encapsulation structure includes a first barrier layer and a first buffer layer which are disposed sequentially, and two lateral sections of the first barrier layer and the first buffer layer disposed on the first barrier layer are respectively packaged by a first lateral sectional barrier layer, and wherein a width range of the first lateral sectional barrier layer ranges from 200 μm to 1000 μm.

2. The display panel as claimed in claim 1, wherein a width of the first barrier layer and a width of the first buffer layer are equal.

3. The display panel as claimed in claim 1, wherein a thickness range of the first lateral sectional barrier layer ranges from 200 μm to 2000 μm.

4. The display panel as claimed in claim 1, wherein the first buffer layer comprises a second barrier layer and a second buffer layer which are sequentially disposed, and two lateral sections of the second barrier layer and the second buffer layer disposed on the second barrier layer are respectively packaged by a second lateral sectional barrier layer.

5. A display device, comprising the display panel as claimed in claim 1.

6. The display device as claimed in claim 5, wherein a width of the first barrier layer and a width of the first buffer layer are equal.

7. The display device as claimed in claim 5, wherein a thickness range of the first lateral sectional barrier layer ranges from 200 μm to 2000 μm.

8. The display device as claimed in claim 5, wherein the first buffer layer comprises a second barrier layer and a second buffer layer which are sequentially disposed, and two lateral sections of the second barrier layer and the second buffer layer disposed on the second barrier layer are respectively packaged by a second lateral sectional barrier layer.

9. A manufacturing method for manufacturing the display panel as claimed in claim 1, wherein the manufacturing method comprises:

providing a substrate layer and the display layer;

depositing the first barrier layer and the first buffer layer; and depositing the first lateral sectional barrier layer on the lateral sections of the first barrier layer and the first buffer layer, wherein the first lateral sectional barrier layer packages the lateral sections of the first barrier layer and the first buffer layer, and wherein when depositing the first barrier layer and the first buffer layer, a same mask plate is used.

10. The manufacturing method as claimed in claim 9, wherein a laser induced chemical vapor deposition manner is used to deposit the first lateral sectional barrier layer.

11. The manufacturing method as claimed in claim 9, wherein a chemical vapor deposition manner or an atomic layer deposition manner is used to deposit the first barrier layer.

12. The manufacturing method as claimed in claim 9, wherein a chemical vapor deposition manner, an ink printing manner, or an atomic layer deposition manner is used to deposit the first buffer layer.

* * * * *